(12) United States Patent
Yonezawa et al.

(10) Patent No.: US 6,504,164 B2
(45) Date of Patent: Jan. 7, 2003

(54) ELECTRON BEAM APPARATUS

(75) Inventors: Akira Yonezawa; Seiji Morita; Mitsuyoshi Satou, all of Chiba (JP)

(73) Assignee: Seiko Instruments Inc. (JP)

(*) Notice: Subject to any disclaimer, the term of this patent is extended or adjusted under 35 U.S.C. 154(b) by 0 days.

(21) Appl. No.: 09/740,662

(22) Filed: Dec. 19, 2000

(65) Prior Publication Data
US 2001/0011702 A1 Aug. 9, 2001

(51) Int. Cl.⁷ .................................................. H01J 37/28
(52) U.S. Cl. ..................................... 250/492.3; 250/310
(58) Field of Search ............................... 250/492.3, 310

(56) References Cited
U.S. PATENT DOCUMENTS
5,894,124 A * 4/1999 Iwabuchi et al. ........... 250/310
* cited by examiner Primary Examiner—Bruce Anderson
Assistant Examiner—Zia R. Hashmi
(74) Attorney, Agent, or Firm—Adams & Wilks

(57) ABSTRACT

The invention is to observe semiconductor wafers with higher resolution at a low acceleration voltage—in particular, achieving such high-resolution observability when a wafer is inclined or tilted at large angles. A composite lens is used which consists essentially of a single-pole or monopole magnetic field type lens and an electrostatic field invasive lens whereas an electrode of the electrostatic field invasive lens which opposes the wafer is made of a magnetic material while letting a high voltage of the negative polarity be applied to this electrode and the wafer. Even when the wafer is tilted, any astigmatism and axis failure will hardly occur.

27 Claims, 10 Drawing Sheets

ELECTRON BEAM APPARATUS

BACKGROUND OF THE INVENTION

1. Field of the Invention

The present invention relates to electron beam apparatus capable of high-resolution observation at low acceleration voltages.

2. Description of the Related Art

In recent years, semiconductor integrated circuit patterns are shrinking more and more, which in turn strongly requires, during semiconductor microfabrication processes, an enhanced ability to achieve SEM observation thereof with higher resolution at low acceleration sample incidence voltages of 1 kV or less. To this end, it is important to reduce aberration of an objective lens of a SEM mirror tube or barrel—especially, chromatic aberration. Methods for doing this include a method for employing in combination a composite objective lens with a single-pole or "monopole" magnetic field type lens and an electrostatic lens. As shown in Japanese Patent Laid-Open Nos. 199459/1998 and 25895/1999 (FIGS. 4 and 5), electrodes 3a, 43b("3" in FIG. 5) are provided between a monopole lens 4 and sample 5 for applying the same voltage potential of negative polarity to the electrode 43b (3 in FIG. 5) and the sample 5 to thereby reduce aberration of an objective lens while at the same time suppressing astigmatic aberration or astigmatism otherwise occurring due to sample tilting thereby enabling accomplishment of high-resolution observation. However, since it is of the structure with a built-in electrostatic lens mounted between a single magnetic pole and sample, the resulting distance between the single magnetic pole's top surface and the sample becomes relatively larger; thus, it has been difficult to further reduce the aberration.

Other prior known examples of the composite lens using a combination of the monopole lens and electrostatic lens with the sample-opposing electrode made of magnetic material are as follows.

In an example disclosed in Japanese Patent Laid-Open No. 17369/1998 (FIG. 6), "magnetic poles (8, 8a) of an objective lens have a shape for creating a magnetic field on the sample side while comprising one or more axially symmetrical acceleration electrodes (10a, 10b) disposed in an axial direction of an electron beam passage unit of the objective lens for enabling penetration of primary electrons, means for applying a positive voltage to the acceleration electrodes, an electric field correction electrode (11) capable of permitting penetration of the primary electrons, which is disposed outside of a specified electrode (10b) of said acceleration electrodes that is nearest to the sample or alternatively disposed on the sample side, and means for applying a negative voltage to the correction electrode, wherein . . . the electrode (10b) of said acceleration electrodes nearest to the sample is comprised of a magnetic material . . . . " However, in view of the fact that the electrode 10b made of magnetic material is applied a positive voltage potential and the sample is set at Earth potential, once the sample is tilted, the electric field near or around an optical axis becomes asymmetrical resulting in a decrease in secondary electron detection efficiency along with creation of aberration. It is the one that attempts to solve this problem by canceling or bucking by an electric field of the electric field correction electrode 11 as provided outside of the electrode 10b; obviously, this must cause an application voltage to the electrode to change depending upon a tilt angle of the sample, resulting in an increase in troublesome procedure while increasing complexities of arrangement.

In another example disclosed in Japanese Patent Laid-Open No. 120950/1999 (FIG. 7), a third pole piece (13) is installed between a first pole piece (70) and a second pole piece (71) in a similar way to that of the above-noted example, wherein "the third pole piece . . . is not magnetically contact with the other two pole pieces and is put in . . . a magnetic field . . . as formed between the first and second pole pieces for extraction of part of this magnetic field," thereby enabling application of a positive or negative voltage potential to the third pole piece. However, in case a negative voltage potential is applied to the third pole piece, since the sample is applied no voltage potentials, there inevitably occur when tilting the sample a decrease in secondary electron detection efficiency and creation of aberration as in the above-stated related art.

SUMMARY OF THE INVENTION

An object of the present invention is to achieve further improved resolution in low-acceleration voltage electron beam apparatus, especially while tilting a sample.

To attain the foregoing object, in an electron beam apparatus in accordance with the invention as disclosed herein, Firstly, a sample is installed within a lens magnetic field as formed adjacent to a magnetic pole placed on the side of an electron source, wherein the electron source-side magnetic pole is subdivided into a magnetic pole spaced far from the sample and a magnetic pole near the sample, and wherein an electromagnetic field composite lens is provided for applying negative voltage potentials to the magnetic pole (3b) near the sample and the sample when the sample is tilted.

Second, the magnetic pole near the sample and the sample are arranged so that these are applied the same voltage potential of the negative polarity.

Third, a top surface of the magnetic pole (4a) far from the sample is placed closer in position to the sample than an electrically insulative material between the magnetic pole far from the sample and the magnetic pole near the sample.

Fourth, the magnetic pole near the sample and the sample are applied the same voltage potential of the negative polarity.

Fifth, a sample is installed between mutually opposing magnetic poles, that is, a magnetic pole placed on the side of an electron source and a magnetic pole placed on the opposite side to the electron source, wherein the electron source-side magnetic pole is further subdivided into a magnetic pole far from the sample and a magnetic pole near the sample, and wherein an electromagnetic field composite lens is provided for applying negative voltage potentials to the magnetic pole (3b) near the sample and the sample when the sample is tilted.

Sixth, the sample and the magnetic pole opposing this sample are applied the same negative voltage.

Seventh, a top surface (4a) of the magnetic pole far from the sample is placed closer to the sample than an electrical insulative material between the magnetic pole far from the sample and the magnetic pole near the sample.

Eighth, the near-the-sample magnetic pole and the sample are applied the same voltage potential of the negative polarity.

Ninth, a sample is installed between opposing magnetic poles, i.e. a magnetic pole placed on the side of an electron source and a magnetic pole placed on the opposite side to the electron source, wherein the electron source-side magnetic pole is further subdivided into a magnetic pole (4a) far from the sample and a magnetic pole (3b) near the sample, wherein the magnetic pole on the opposite side to the electron source is further divided into a magnetic pole (3b') near the sample and a magnetic pole (4a') far from the sample, and wherein an electromagnetic field composite lens is provided for applying negative voltage potentials to the both magnetic poles (3b, 3b') near the sample and the sample (5) when the sample is tilted.

Tenth, the same voltage potential of negative polarity is applied to the sample and the both magnetic poles which oppose the sample.

Eleventh, at a respective one of the electron source-side magnetic pole and the magnetic pole on the opposite side to the electron source, a top surface of the magnetic pole (4a, 4a') far from the sample is placed nearer to the sample than an electrical insulative material (7, 7') between the magnetic pole far from the sample and the magnetic pole near the sample.

Twelfth, the same voltage potential of negative polarity is applied to the magnetic pole near the sample and the sample.

Thirteenth, it is possible, when the sample is not tilted, to apply the voltage potential of the magnetic pole near the sample on the electron source side at a zero or positive voltage potential.

DESCRIPTION OF THE PREFERRED EMBODIMENTS

An electron beam as accelerated at an electron gun voltage 2 kV is focused onto a specimen or sample with an incident voltage of 1 kV, by a magnetic field as created between an electron source-side magnetic pole and a sample-side magnetic pole along with a deceleration electric field between an Earth electrode and the sample-side magnetic pole with a negative voltage potential of −1 kV being applied thereto and also a magnetic field between the sample-side magnetic pole and the sample of interest being presently applied the negative voltage potential of −1 kV. Secondary electrons that have been produced by irradiation of an electronic probe are wound up by the above-noted electromagnetic field and then detected by a secondary electron detector as provided on the electron source side, thereby forming an image (see FIG. 1). Since the sample and the magnetic pole opposing this sample are applied at the same negative voltage potential, asymmetrical electric fields will no longer take place on or over the optical axis when the sample is tilted. Accordingly, any decrease in secondary electron detection efficiency and astigmatism will never occur, thus enabling obtainment of high-resolution images.

Figure 1:
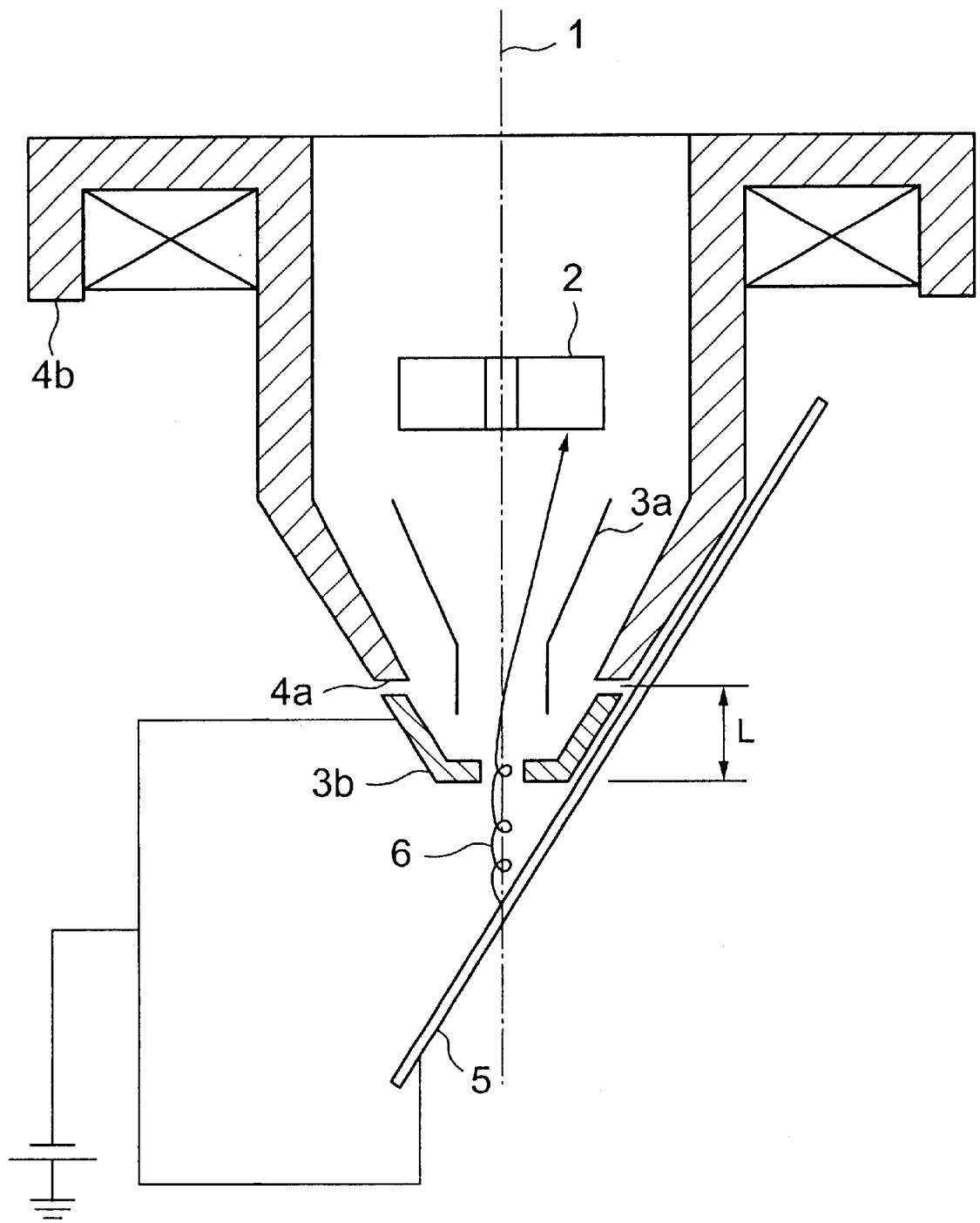
FIG. 1 is a diagram schematically showing one embodiment of an objective lens of an electron beam apparatus in accordance with the present invention.

Referring to FIG. 1, there is shown across-sectional view of an electromagnetic field composite objective lens in accordance with the present invention. The lens shown is of a hollow circular truncated cone shape. In FIG. 1, a magnetic pole 3b also functions as an electrode. Reference character "3a" denotes an electrode with a funnel-like shape. A primary electron beam 1 as emitted from an electron gun assembly is accelerated at 2 kV to pass through a hole or aperture that is provided in an axially symmetrical secondary electron detector 2; thereafter, upon receipt of the focusing action of a magnetic field as formed between a magnetic pole 4a spaced far from a sample and magnetic pole 3b near the sample, the beam is decelerated to 1 kV by a deceleration electric field between the electrode 3a being applied with a zero or positive voltage potential and the magnetic pole 3b made of a magnetic material with a negative voltage potential of −1 kV being applied thereto, and then focused by a magnetic field formed between the magnetic pole 3b and a circumferential magnetic pole 4b for irradiation at a sample incidence voltage of 1 kV onto the sample 5 being presently applied a negative voltage potential of −1 kV. An electron beam probe is such that a scanning deflection coil, not shown in FIG. 1, is used to scan the sample on its surface while a secondary electron beam 6 thus generated is wounded up by the above-noted electromagnetic field to be detected by the secondary electron detector 2. As the magnetic pole 3b and the sample are set at the same potential level, any asymmetric electric fields due to tilting of the sample will never take place. Accordingly, there are no anti-points and axis failure, which in turn makes it possible to obtain a high-resolution image.

Figure 4:
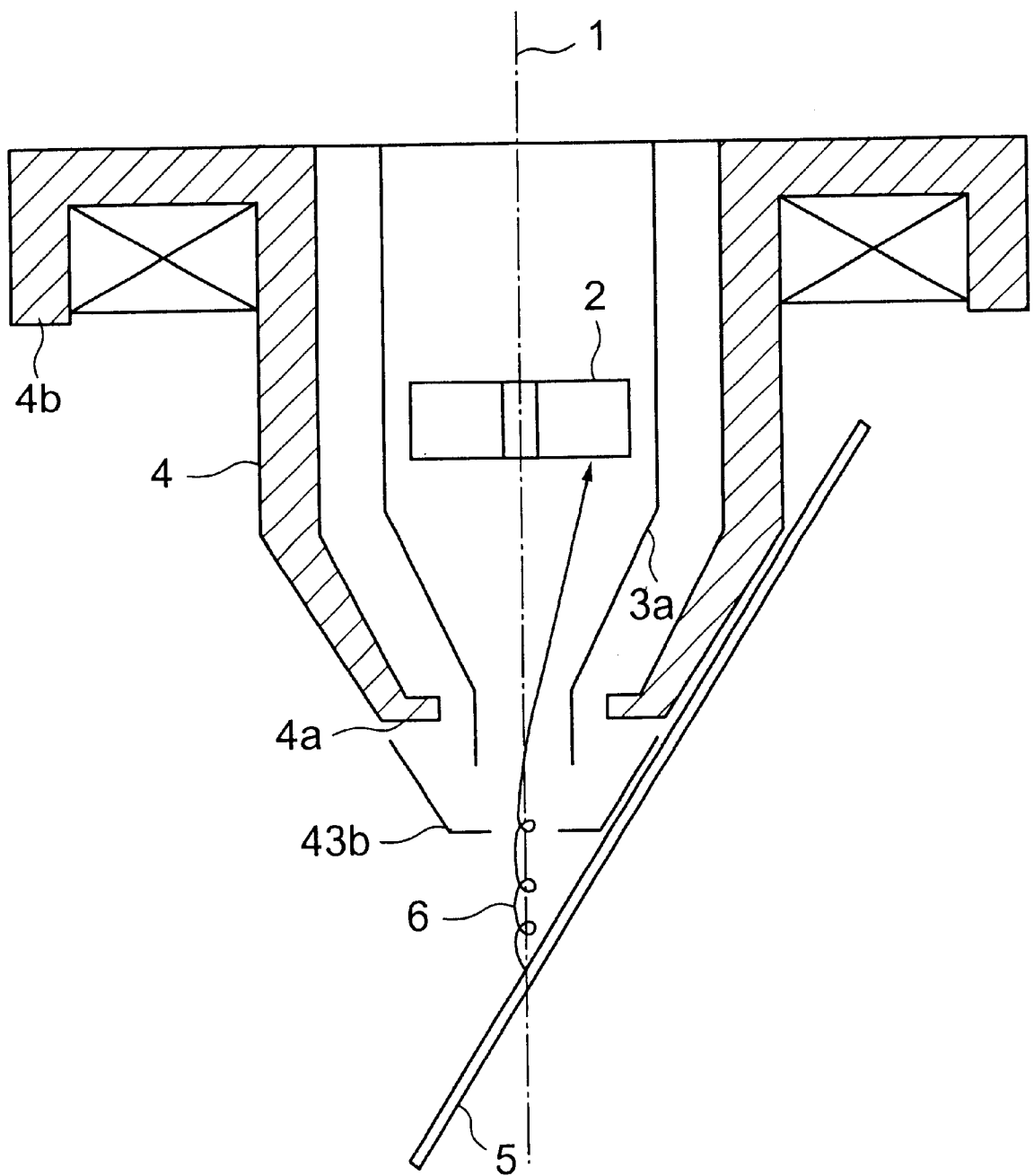
FIG. 4 is a diagram schematically showing an embodiment of an object lens of one related art electron beam apparatus.
Figure 5:
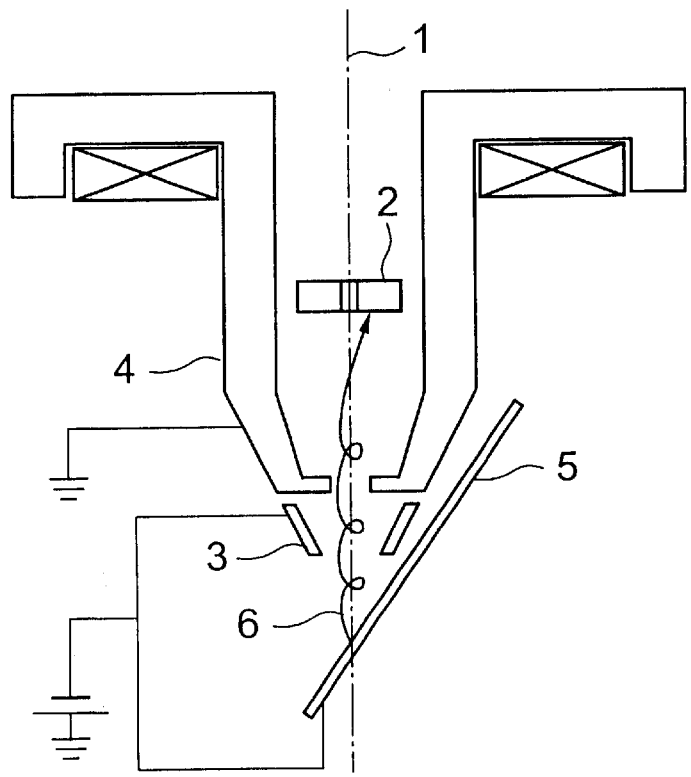
FIG. 5 is a diagram schematically showing an embodiment of the object lens of one related art electron beam apparatus.
Figure 6:
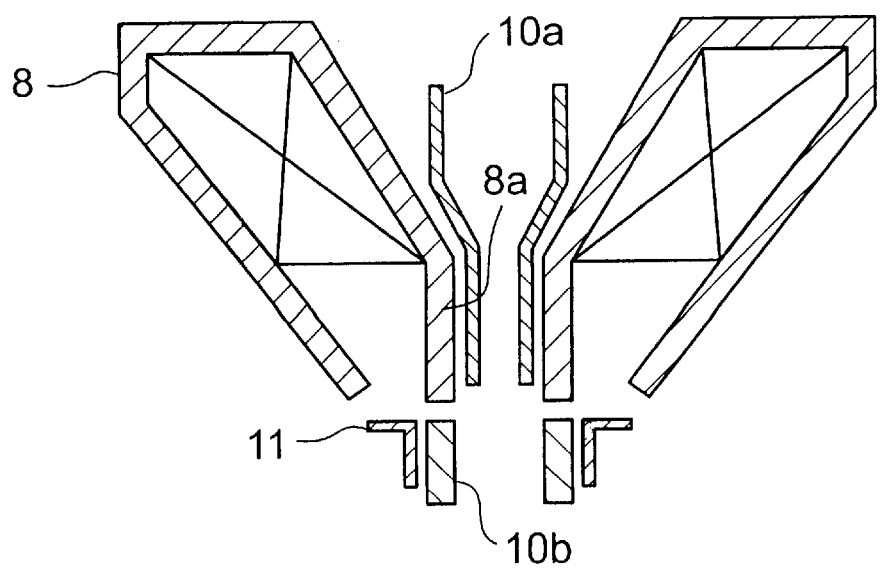
FIG. 6 is a diagram schematically showing an embodiment of the object lens of one related art electron beam apparatus.
Figure 7:
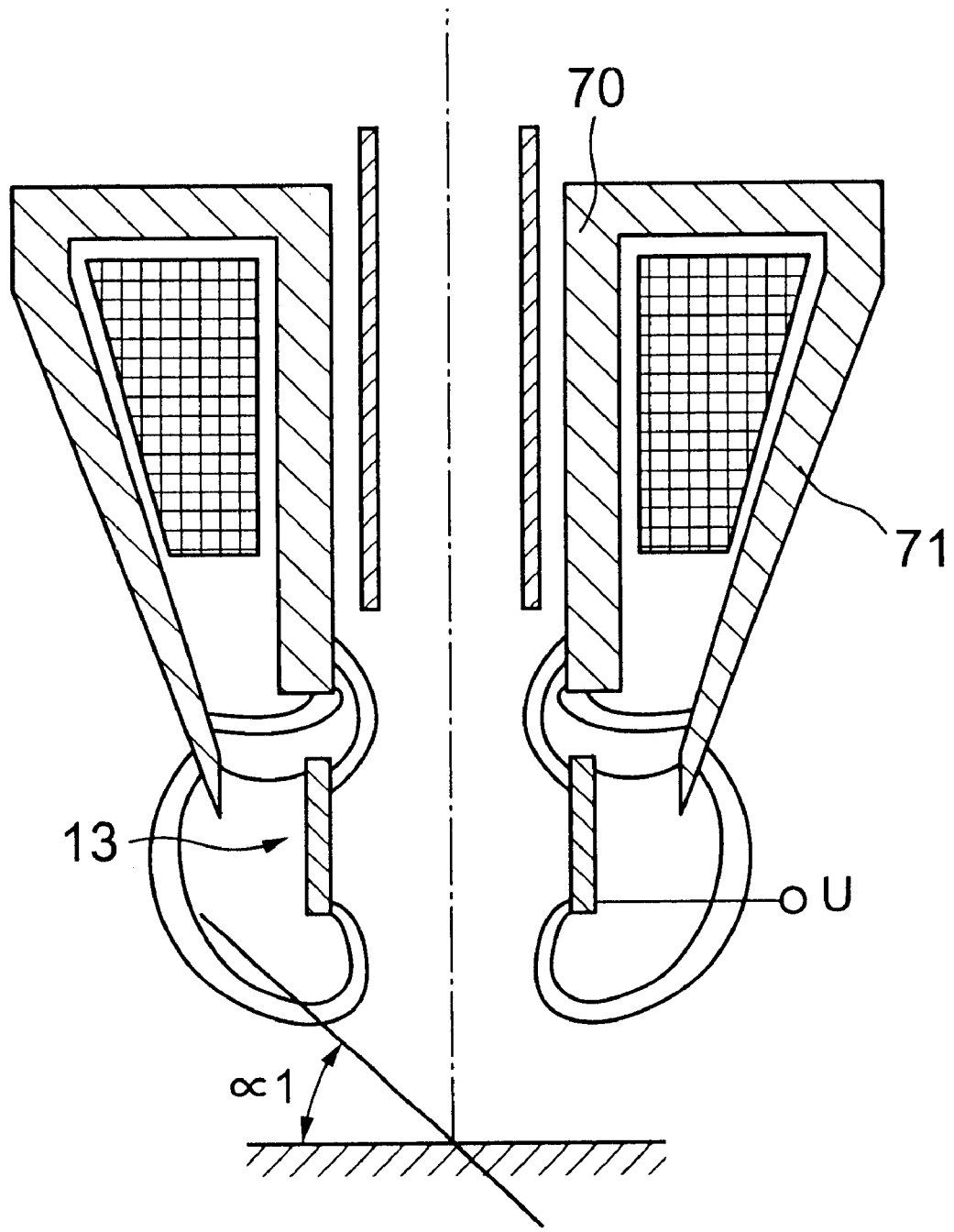
FIG. 7 is a diagram schematically showing an embodiment of the object lens of one related art electron beam apparatus.
Figure 8:
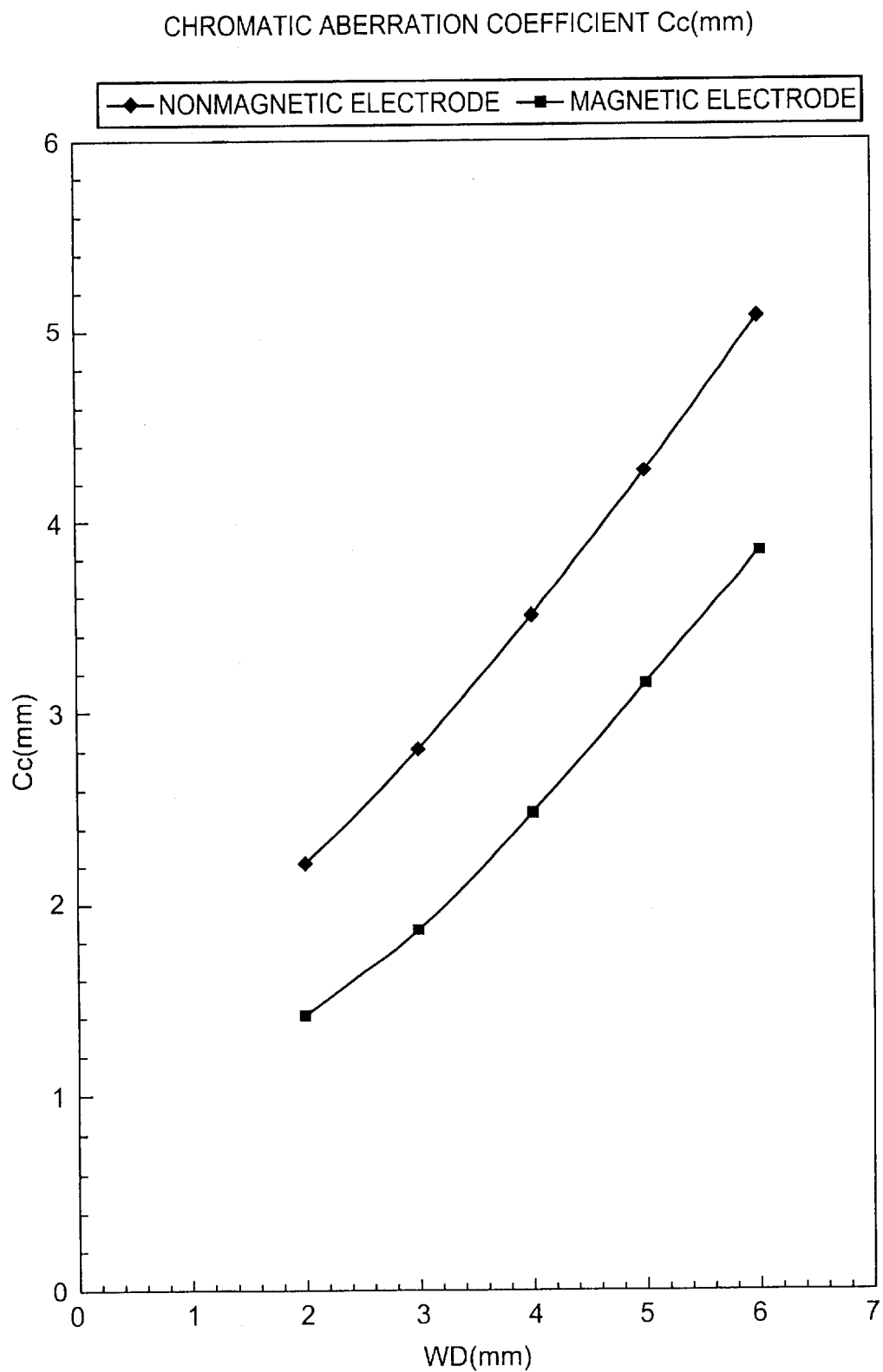
FIG. 8 is an exemplary graph showing a relation of WD versus chromatic aberration coefficient in an example of this invention and the related art.

See FIG. 8, which shows one example of the chromatic aberration coefficient Cc in the case of constituting an electrode 43b from a nonmagnetic material (nonmagnetic electrode) as in FIG. 4 and in the case of letting certain part corresponding to the electrode 43b be formed of a magnetic material with the same size as that in FIG. 4 and using it as the magnetic pole 3b (magnetic electrode) as in FIG. 1. An electron gun voltage is set at 2 kV, the electrode 3a is potentially set at Earth potential, and the magnetic pole 3b and sample 5 are potentially set at −1 kV; additionally, a spacing or "gap" between the magnetic pole 4a and magnetic pole 3b measures 2 mm, and a distance L between the center of such gap and the magnetic pole 3b's surface opposing the sample 5 was 2 mm. A lateral axis WD is the distance between the sample opposing surface of either the electrode 43b or magnetic pole 3b and the sample 5. It would be apparent from viewing FIG. 8 that a smaller value of Cc is obtainable with respect to the same WD when the part corresponding to the electrode 43*b* of FIG. 4 is made of magnetic material as in FIG. 1, leading to the capability of obtaining images of higher resolution. Although FIG. 8 shows the Cc value in case the electrode 3*a* is set at Earth potential, if a positive voltage is applied thereto then a further smaller value of Cc will be obtained. Optionally, the electrode 3*a* may be omitted for purposes of simplifying the arrangement. In this case, the magnetic pole 4*a* is at Earth potential. A Cc value in case the magnetic pole 4*a* is set at Earth potential becomes greater than the Cc value shown in FIG. 8.

Although in FIG. 1 the magnetic pole 3*b* and the sample 5 are set at the same potential, these may be different at negative potentials. As a matter of fact, when letting the magnetic pole 3*b* be potentially different by several tens of V, generation of anti-points or the like remains very little even upon tilting at large angles, which will lead to improvement in secondary electron detection efficiency in some cases. In the event that the sample is not tilted, no antipoints and axis failures will take place even when applying a potential of the magnetic pole 3*b* to a zero or positive voltage potential while simultaneously letting the sample potential stay at a high voltage of the negative polarity. In this case, it becomes possible to obtain a smaller value of Cc than that when applying a negative potential to the magnetic pole 3*b* by the deceleration electric field near or around the sample, which in turn makes it possible to obtain an image with higher resolution.

Figure 9:
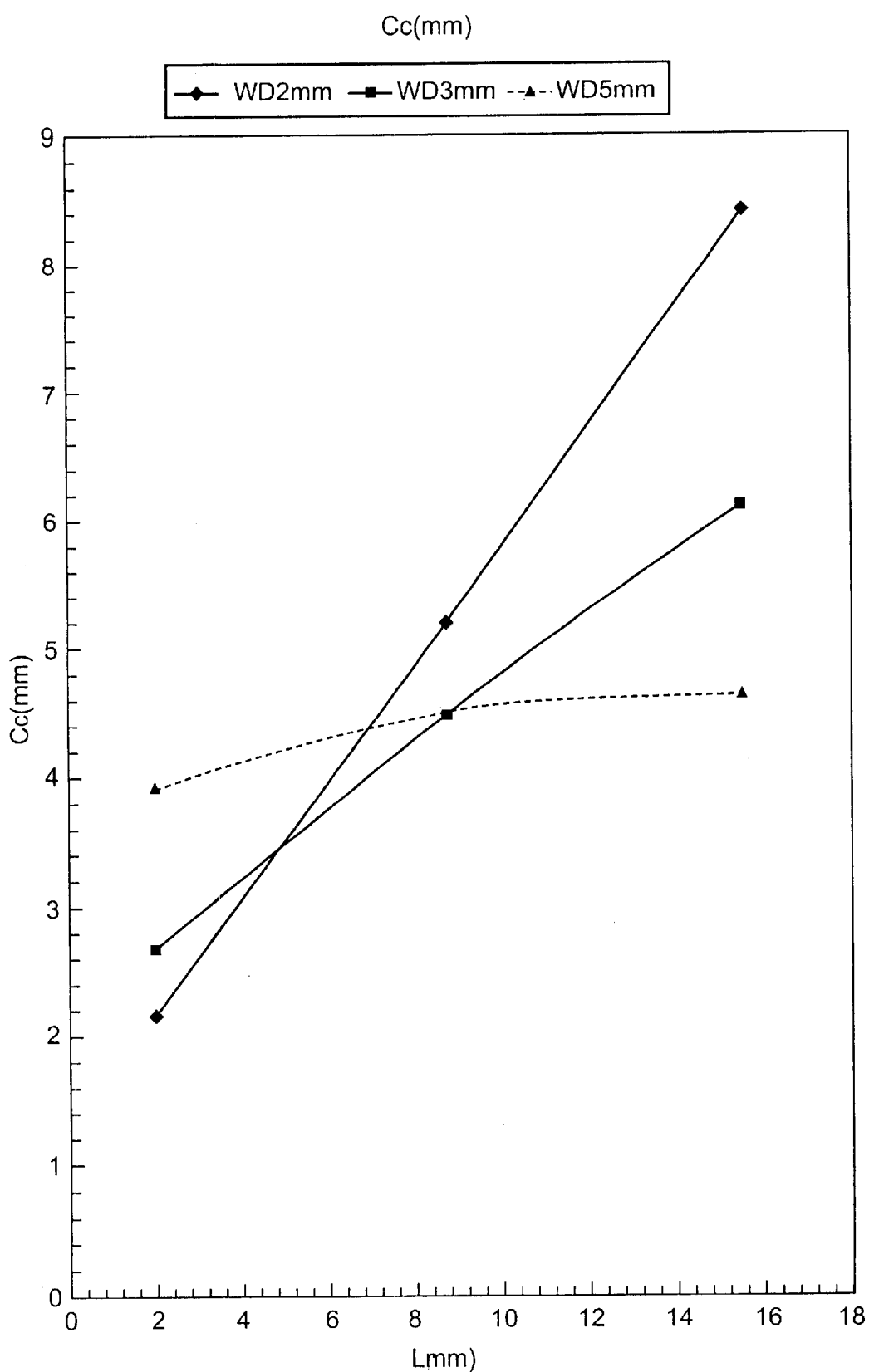
FIG. 9 is an exemplary graph showing a relation of chromatic aberration coefficient with respect to the position of a gap between magnetic poles.

Turning now to FIG. 9, there is shown Cc relative to the distance L between the center of a gap between the magnetic pole 4*a* and magnetic pole 3*b* (also functioning as an electrode) and the sample-opposing surface of magnetic pole 3*b* while using WD as a parameter. WD values of 2, 3, 5 mm correspond to the wafer's possible maximum tilt angles of 30, 45 and 60 degrees, respectively. Upon tilting at 45 degrees for relatively wide use during wafer tilt observation, that is, in the case of WD=3 mm, the greater the distance L, the much greater the Cc value, resulting in a decrease in resolution. Consequently, in order to obtain a smaller Cc value, it is desirable that the position of the gap between the magnetic pole 4*a* and magnetic pole 3*b*—i.e. the position of a magnetic field as created between the magnetic pole 4*a* and magnetic pole 3*b*—be placed in close proximity to the sample-opposing surface of the magnetic pole 3*b*.

Figure 2:
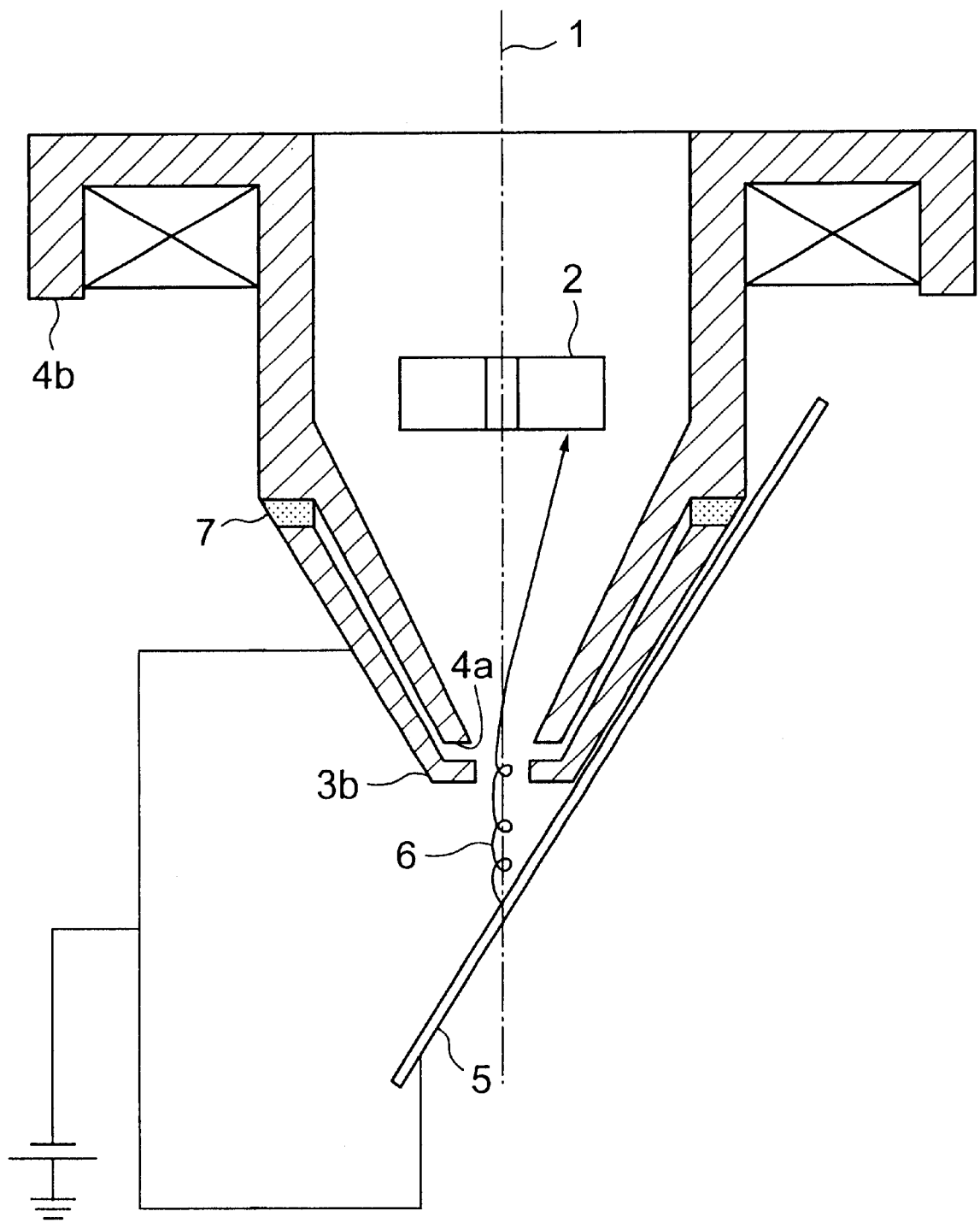
FIG. 2 is a diagram schematically showing another embodiment of the objective lens of an electron beam apparatus in accordance with this invention.
Figure 10:
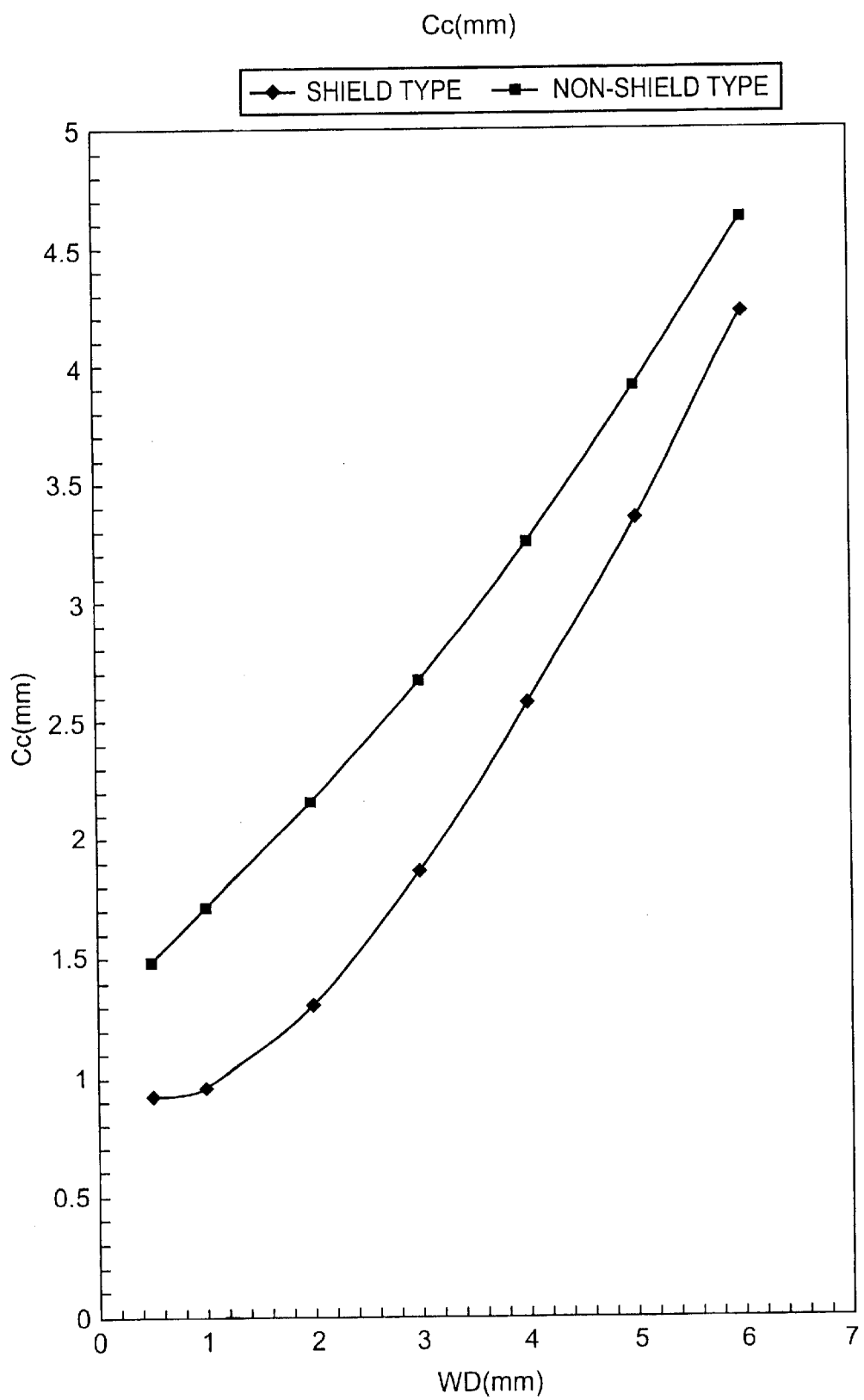
FIG. 10 I an exemplary graph showing a relation of WD versus chromatic aberration coefficient in an example of the invention.

However, it is actually not easy, at a magnetic pole distal end portion with a tapered pin-like shape which permits tilting of the sample at large angles, to instal an electrically insulative or dielectric material 7 used for maintaining a high voltage at a location adjacent to the magnetic pole 3*b*'s sample opposing face while at the same time preventing unwanted charge-up or electrification of an electron beam. See FIG. 2, which shows an exemplary structure for solving this problematic matter. More specifically, the sample 5 is installed within a magnetic field that is formed adjacent to the magnetic pole as placed on the electron source side, wherein this electron source-side magnetic pole is subdivided into the magnetic pole 4*a* spaced far from the sample and the magnetic pole 3*b* near the sample, wherein the top face 4*a* of the magnetic pole far from the sample is placed closer in position to the sample than the electrical insulative material 7 between the magnetic pole far from the sample and the magnetic pole near the sample, and wherein the magnetic pole 4*a* is applied Earth potential while applying the same potential of the negative polarity to the near-the-sample magnetic pole 3*b* and the sample 5. In this case a deceleration electric field is formed between the magnetic pole 4*a* and magnetic pole 3*b*. In view of the fact that it is easy to provide the electrical insulative material at the location distant from the tapered pin-like magnetic pole distal end portion and that a magnetic field creatable between the magnetic pole 4*a* and magnetic pole 3*b* is expected to be positioned adjacent to the sample-opposing face of the magnetic pole 3*b*, it is possible to make smaller the Cc of this composite lens. In FIG. 10, there are shown one example of Cc of this composite lens (named herein as "shield type") and example of a non-shield type composite lens (corresponding to that shown in FIG. 1) with respect to WD. In any one of the shield-type composite lens and the nonshield-type composite lens, the electron gun voltage is set at 2 kV, and the magnetic pole 3*b* and sample 5 are potentially set at −1 kV; additionally, the gap between the magnetic pole 4*a* and magnetic pole 3*b* is 2 mm, and the distance L between the gap center and the magnetic pole 3*b*'s surface opposing the sample 5 was 2 mm. In FIG. 2, depiction of the Earth electrode 3*a* is omitted. In the nonshield type composite lens also, calculations were done while omitting the Earth electrode 3*a* shown in FIG. 1, for purposes of comparison with the shield type lens of FIG. 2. A lateral axis WD is the distance between the magnetic pole 3*b*'s sample opposing surface and the sample 5. It would be readily understandable that the shield type composite lens is capable of obtaining rather smaller Cc than the nonshield type lens.

Although in FIG. 2 the electrode 3*a* which can be applied at Earth or positive potential is omitted, the electrode 3*a* may alternatively be attached. In this case, if the sample side top surface of the electrode 3*a* is positioned between the magnetic pole 4*a* and magnetic pole 3*b* then it is possible to obtain smaller Cc than that shown in FIG. 10.

Figure 3:
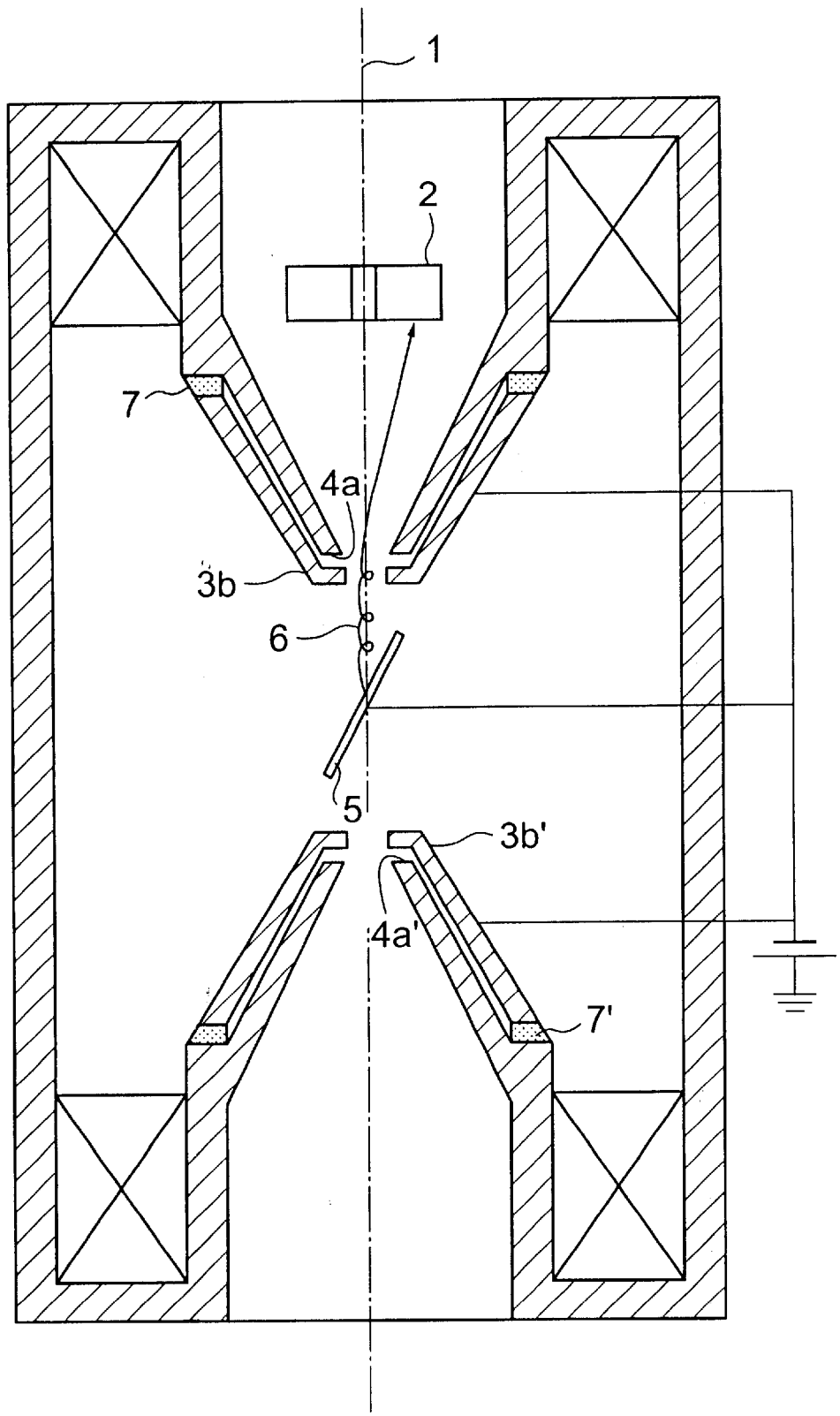
FIG. 3 is a diagram schematically showing yet another embodiment of the object lens of an electron beam apparatus in accordance with the invention.

FIG. 3 shows an example wherein a relatively small-diameter sample 5 is installed between the magnetic poles 3*b*, 4*a* and magnetic poles 3*b*', 4*a*' while applying a high voltage of the negative polarity to the magnetic pole 3*b*, magnetic pole 3*b*' and sample 5. When compared to that of FIG. 2, this is capable of installing the sample within magnetic fluxes of higher density, which in turn makes it possible to obtain much smaller Cc. Due to the fact that respective voltage potentials are the same, in case the sample is tilted, there are no risks as to reduction of the secondary electron detection efficiency and creation of any aberration, thus enabling achievement of high-resolution observation. Note here that the electrode 3*a* capable of application to Earth or positive potential may alternatively be attached to the electron source side as in the case of FIG. 2.

Figure 11:
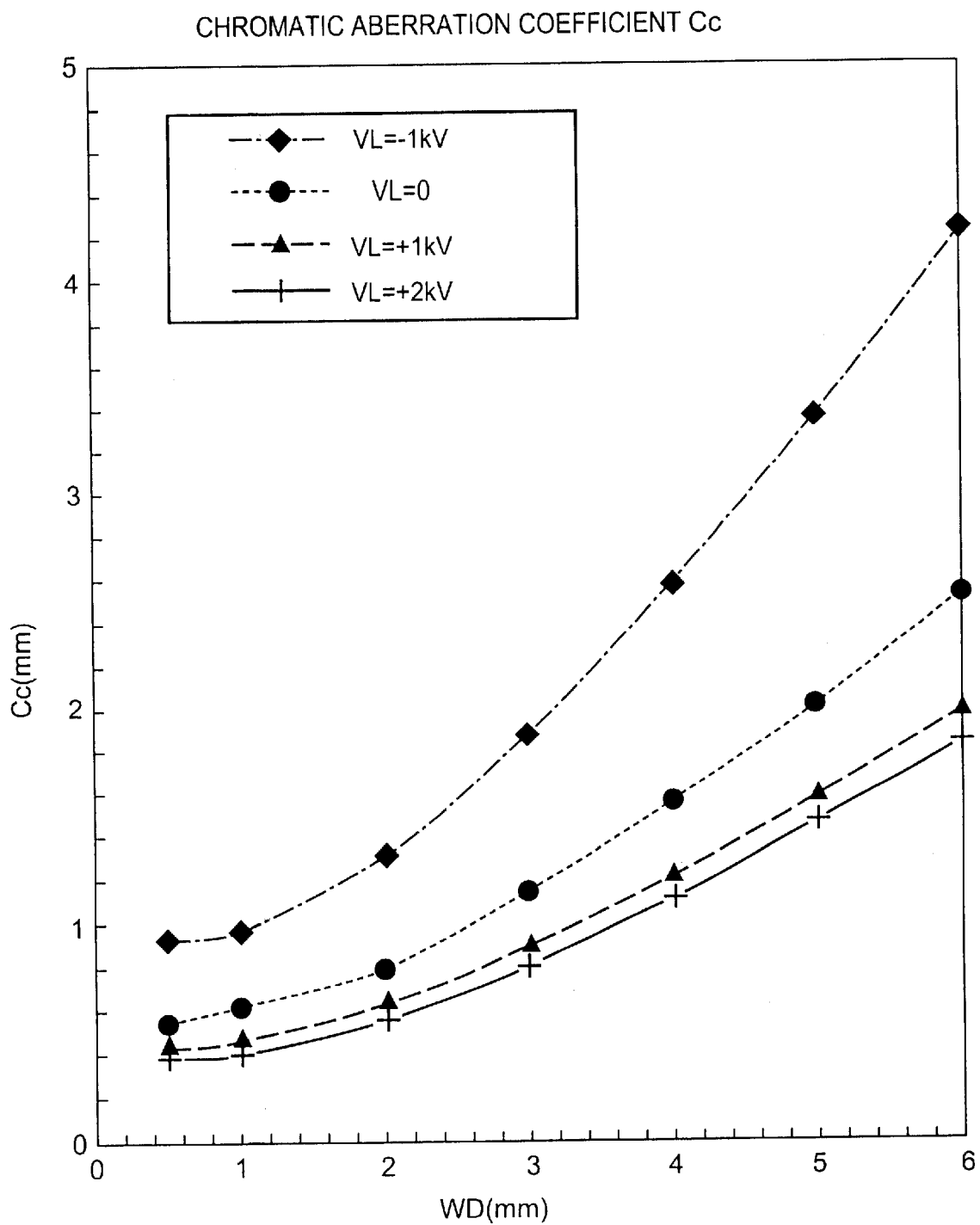
FIG. 11 is an exemplary graph showing a relation of WD versus chromatic aberration coefficient in the shape of this invention shown in FIG. 2.

Although in FIG. 3 the magnetic pole on the opposite side to the electron source is further divided into the magnetic pole 3*b*' near the sample and the magnetic pole 4*a*' spaced far from the sample while applying a negative voltage potential to the near-the-sample magnetic pole 3*b*' and applying a negative voltage potential to the sample, this is modifiable so that the magnetic pole on the opposite side to the electron source is not divided and also the negative voltage potential is not applied thereto. This can be said because in cases where the tilt of the sample 5 is not large, the asymmetry of an electric field on the electron source side than the sample 5 is not large; thus, influence upon an electron beam falling onto the sample is made smaller. Optionally, with the shapes shown in FIGS. 1–3, in case the sample is not tilted at large angles, the near-the-sample magnetic pole 3*b* may be arranged so that it is applied zero or positive voltage potential. Shown in FIG. 11 is a chromatic aberration coefficient Cc in the event that the shape of FIG. 2 is used and −1 kV is applied to the sample while applying a positive voltage potential VL to the magnetic pole 3b. When compared to the case of applying the negative voltage potential VL=−1 kV (same as the Cc shown as the shield type in FIG. 10), smaller cc is obtainable with respect to the same WD when applying zero VL=0 or positive voltage potential VL=+1 kV or alternatively VL=+2 kV; thus, it is possible to obtain an image of much higher resolution. In case the sample is tilted at large angles, the resultant electric field becomes asymmetrical resulting in occurrence of significant astigmatism or alternatively incapability to detect secondary electrons: in view of this, the magnetic pole 3b is designed so that the same negative voltage potential as that of the sample is applied thereto in the way stated supra.

It is possible to achieve high-resolution SEM observation at a sample incidence voltage of about 1 kV or below while letting the sample be tilted at large angles.

What is claimed is:

1. In an electron beam apparatus having an electromagnetic field compound lens: wherein
  a sample is installed during use of the apparatus within a lens magnetic field formed adjacent to a magnetic pole placed on the side of an electron source,
  the electron source-side magnetic pole being subdivided into a magnetic pole spaced far from the sample and a magnetic pole near the sample, and
  negative voltage potentials are applied to the magnetic pole near the sample and the sample when the sample is tilted.

2. The electron beam apparatus as claimed in claim 1, wherein said voltage potentials are the same voltage potential.

3. The electron beam apparatus as claimed in claim 1, wherein a top surface of the magnetic pole far from the sample is placed closer to the sample than an electrically insulative material between the magnetic pole far from the sample and the magnetic pole near the sample.

4. The electron beam apparatus as claimed in claim 3, wherein the same negative voltage potential is applied to the magnetic pole near the sample and the sample.

5. In an electron beam apparatus having an electromagnetic field compound lens: wherein
  a sample is installed during use of the apparatus between mutually opposing magnetic poles comprising a magnetic pole placed on the side of an electron source and a magnetic pole placed on the opposite side to the electron source,
  the electron source-side magnetic pole being further divided into a magnetic pole far from the sample and a magnetic pole near the sample, and
  negative voltage potentials are applied to the magnetic pole near the sample and the sample when the sample is tilted.

6. The electron beam apparatus as claimed in claim 5, wherein the same voltage potential of negative polarity is applied to the magnetic pole near the sample and the sample.

7. The electron beam apparatus as claimed in claim 5, characterized in that a top surface of the magnetic pole far from the sample is placed closer to the sample than an electrical insulative material between the magnetic pole far from the sample and the magnetic pole near the sample.

8. The electron beam apparatus as claimed in claim 7, wherein the same negative voltage potential is applied to the magnetic pole near the sample and the sample.

9. In an electron beam apparatus having an electromagnetic field compound lens: wherein
  a sample is installed during use of the apparatus between opposing magnetic poles, namely a magnetic pole placed on the side of an electron source and a magnetic pole placed on the opposite side to the electron source,
  the electron source-side magnetic pole being further divided into a magnetic pole far from the sample and a magnetic pole near the sample,
  the magnetic pole on the opposite side to the electron source being further divided into a magnetic pole near the sample and a magnetic pole far from the sample, and
  negative voltage potentials are applied to both of the magnetic poles near the sample and to the sample when the sample is tilted.

10. The electron beam apparatus as claimed in claim 9, wherein the same voltage potential of negative polarity is applied to the both magnetic poles opposing the sample and the sample.

11. The electron beam apparatus as claimed in claim 9, wherein at a respective one of the electron source-side magnetic pole and the magnetic pole on the opposite side to the electron source, a top surface of the magnetic pole far from the sample is placed closer to the sample than an electrical insulative material between the magnetic pole far from the sample and the magnetic pole near the sample.

12. The electron beam apparatus as claimed in claim 11, wherein the same voltage potential of negative polarity is applied to the both magnetic poles opposing the sample and the sample.

13. The electron beam apparatus as claimed in anyone of claims 1 to 12, enabling, when the sample is not tilted, application of the voltage potential of the magnetic pole near the sample on the electron source side at a zero or positive voltage potential.

14. In an electron beam apparatus for observing a sample, the combination comprising:
  an electron beam source for producing an electron beam; an electromagnetic field compound lens for focusing the electron beam and having a first magnetic pole located closer to the electron source than to a sample to be inspected and a second magnetic pole located closer to the sample than to the electron beam source; a sample holder for positioning the sample within a magnetic field formed by the compound lens and tilting the sample with respect to the electromagnetic field compound lens; a voltage source for applying negative voltage potentials to the second magnetic pole and the sample when the sample is tilted so that an asymmetric electric field is not produced due to the tilting; and a secondary electron detector for detecting secondary electrons generated when the sample is irradiated with the electron beam.

15. An electron beam apparatus according to claim 14; wherein the compound lens has a truncated cone shape.

16. An electron beam apparatus according to claim 15; wherein the secondary electron detector is disposed within the truncated cone-shaped compound lens and has a hole through which the electron beam passes.

17. An electron beam apparatus according to claim 15; further comprising an electrode disposed within the truncated cone-shaped compound lens.

18. An electron beam apparatus according to claim 17; wherein the voltage source applies a zero or positive voltage to the electrode when a negative voltage is applied to the second magnetic pole to produce a deceleration electric field.

19. An electron beam apparatus according to claim 14; wherein the magnetic pole spaced near the sample also serves as an electrode.

20. An electron beam apparatus according to claim 14; wherein the second magnetic pole is formed of a magnetic material.

21. An electron beam apparatus according to claim 14; wherein the second magnetic pole and the sample have the same negative voltage potential applied thereto when the sample is tilted.

22. An electron beam apparatus according to claim 14; wherein the second magnetic pole and the sample have different negative voltage potentials applied thereto when the sample is tilted.

23. An electron beam apparatus according to claim 22; wherein the negative voltage potentials differ by tens of volts.

24. An electron beam apparatus according to claim 14; wherein a zero or positive potential is applied to the second magnetic pole when the sample is not tilted.

25. An electron beam apparatus according to claim 24; wherein a negative voltage is applied to the sample when the sample is not tilted.

26. An electron beam apparatus according to claim 14; further comprising an electrically insulative material provided between the first and second magnetic poles, the insulative material being located further from the sample than a surface of the first magnetic pole.

27. An electron beam apparatus according to claim 14; further comprising third and fourth magnetic poles located on an opposite side of the sample than the first and second magnetic poles, the third magnetic pole being located closer to the sample than the fourth magnetic pole.

* * * * *

UNITED STATES PATENT AND TRADEMARK OFFICE
CERTIFICATE OF CORRECTION

PATENT NO. : 6,504,164 B2
DATED : January 7, 2003
INVENTOR(S) : Akira Yonezawa et al.

It is certified that error appears in the above-identified patent and that said Letters Patent is hereby corrected as shown below:

Column 7,
Lines 28-30, should read:
2. An electron beam apparatus according to claim 1; wherein the negative voltage potentials applied to the magnetic pole near the sample and the sample have the same value.

Lines 31-35, should read:
3. An electron beam apparatus according to claim 1; further comprising an electrically insulative material provided between the magnetic pole far from the sample and the magnetic pole near the sample, the magnetic poles being configured so that the insulative material is located further from the sample than a surface of the magnetic pole far from the sample.

Lines 36-38, should read:
4. An electron beam apparatus according to claim 3; wherein the same negative voltage potential is applied to the magnetic pole near the sample and the sample when the sample is tilted.

Lines 52-54, should read:
6. An electron beam apparatus according to claim 5; wherein the same voltage potential of negative polarity is applied to the magnetic pole near the sample and the sample when the sample is tilted.

Lines 52-59, should read:
7. An electron beam apparatus according to claim 5; further comprising an electrically insulative material provided between the magnetic pole far from the sample and the magnetic pole near the sample, the magnetic poles being configured so that a surface of the magnetic pole far from the sample is located closer to the sample than the electrically insulative material.

UNITED STATES PATENT AND TRADEMARK OFFICE
CERTIFICATE OF CORRECTION

PATENT NO. : 6,504,164 B2
DATED : January 7, 2003
INVENTOR(S) : Akira Yonezawa et al.

It is certified that error appears in the above-identified patent and that said Letters Patent is hereby corrected as shown below:

Column 8,
Lines 13-16, should read:
10. An electron beam apparatus according to claim 9; wherein the same voltage potential of negative polarity is applied to both of the magnetic poles opposing the sample and the sample when the sample is tilted.

Lines 17-23, should read:
11. An electron beam apparatus according to claim 9; further comprising an electrically insulative material provided between the magnetic pole far from the sample and the magnetic pole near the sample in at least one of the electron source-side magnetic pole and the magnetic pole on the opposite side to the electron source, the magnetic poles being configured so that a surface of the magnetic pole far from the sample is located closer to the sample than the electrically insulative material.

Lines 24-27, should read:
12. An electron beam apparatus according to claim 11; wherein the same voltage potential of negative polarity is applied to both of the magnetic poles opposing the sample and the sample when the sample is tilted.

Lines 28-32, should read:
13. An electron beam apparatus according to any one of claims 1 to 12; wherein a zero or positive voltage is applied to the magnetic pole near the sample on the electron source side when the sample is not tilted.

Signed and Sealed this

Eleventh Day of May, 2004

JON W. DUDAS
*Acting Director of the United States Patent and Trademark Office*